(12) United States Patent
Yoshie

(10) Patent No.: US 9,331,152 B2
(45) Date of Patent: May 3, 2016

(54) SEMICONDUCTOR DEVICE AND METHOD OF MANUFACTURING THE SAME

(71) Applicant: Sanken Electric Co., LTD., Niiza-shi, Saitama (JP)

(72) Inventor: Toru Yoshie, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 14/496,156

(22) Filed: Sep. 25, 2014

(65) Prior Publication Data

US 2015/0091020 A1    Apr. 2, 2015

(30) Foreign Application Priority Data

Sep. 30, 2013   (JP) .................................. 2013-204999

(51) Int. Cl.

| | |
|---|---|
| *H01L 29/16* | (2006.01) |
| *H01L 29/66* | (2006.01) |
| *H01L 21/04* | (2006.01) |
| *H01L 29/78* | (2006.01) |
| *H01L 29/08* | (2006.01) |
| *H01L 29/167* | (2006.01) |
| *H01L 29/417* | (2006.01) |

(Continued)

(52) U.S. Cl.
CPC .......... *H01L 29/1608* (2013.01); *H01L 21/046* (2013.01); *H01L 29/086* (2013.01); *H01L 29/167* (2013.01); *H01L 29/66068* (2013.01); *H01L 29/66674* (2013.01); *H01L 29/7802* (2013.01); *H01L 29/41766* (2013.01); *H01L 29/42368* (2013.01); *H01L 29/45* (2013.01)

(58) Field of Classification Search
CPC ............ H01L 29/1608; H01L 29/7802; H01L 29/7395; H01L 29/7827; H01L 29/66068; H01L 29/66674; H01L 29/086; H01L 29/167
See application file for complete search history.

(56) References Cited

U.S. PATENT DOCUMENTS

| | | | | | |
|---|---|---|---|---|---|
| 4,689,667 | A | * | 8/1987 | Aronowitz ..................... | 257/607 |
| 5,322,802 | A | * | 6/1994 | Baliga et al. .................. | 438/268 |
| 5,770,485 | A | * | 6/1998 | Gardner et al. ............... | 438/162 |

(Continued)

FOREIGN PATENT DOCUMENTS

| | | |
|---|---|---|
| JP | H0964346 | 3/1997 |
| JP | 2000340520 | 12/2000 |

(Continued)

OTHER PUBLICATIONS

Aug. 4, 2015—(JP) Office Action—App 2013-204999—Eng Tran.

*Primary Examiner* — Tucker J Wright
(74) *Attorney, Agent, or Firm* — Banner & Witcoff, Ltd.

(57) ABSTRACT

A semiconductor device includes: a gate oxide film formed on a surface of a semiconductor substrate; a gate electrode formed on the gate oxide film; and a high concentration impurity layer connected to a main electrode and formed on the surface of the semiconductor substrate, wherein an impurity species doped in the high concentration impurity layer comprises a first impurity species of phosphorous and a second impurity species of at least one of argon and nitrogen, a concentration of the second impurity species is higher than a concentration of the first impurity species in a surface of the high concentration impurity layer, and a peak position of a concentration distribution of the first impurity species in a depth direction in the high concentration impurity layer is deeper than a peak position of a concentration distribution of the second impurity species in the depth direction.

10 Claims, 4 Drawing Sheets

(51) Int. Cl.
*H01L 29/423* (2006.01)
*H01L 29/45* (2006.01)

(56) References Cited

U.S. PATENT DOCUMENTS

| | | | | |
|---|---|---|---|---|
| 7,790,557 | B2 * | 9/2010 | Tsuji | H01L 21/0445 |
| | | | | 257/E21.054 |
| 2002/0034852 | A1 * | 3/2002 | Alok | 438/275 |
| 2002/0047125 | A1 * | 4/2002 | Fukuda et al. | 257/77 |
| 2004/0191995 | A1 * | 9/2004 | Koiwa | 438/270 |
| 2005/0062048 | A1 * | 3/2005 | Hayashi et al. | 257/77 |
| 2006/0102908 | A1 * | 5/2006 | Imai et al. | 257/77 |
| 2006/0267022 | A1 * | 11/2006 | Mizukami et al. | 257/77 |
| 2008/0108190 | A1 * | 5/2008 | Matocha | 438/197 |
| 2008/0224149 | A1 * | 9/2008 | Yoshie | 257/77 |
| 2010/0308343 | A1 * | 12/2010 | Suzuki et al. | 257/77 |
| 2012/0313112 | A1 | 12/2012 | Wada et al. | |
| 2013/0062622 | A1 * | 3/2013 | Tsuchiya | 257/77 |

FOREIGN PATENT DOCUMENTS

| | | |
|---|---|---|
| JP | 2002270838 | 9/2002 |
| JP | 2003517204 | 5/2003 |
| JP | 2006024880 | 1/2006 |
| JP | 2006066438 | 3/2006 |
| JP | 2006173584 | 6/2006 |
| JP | 2009182271 | 8/2009 |
| JP | 2012-253293 A | 12/2012 |

* cited by examiner

SEMICONDUCTOR DEVICE AND METHOD OF MANUFACTURING THE SAME

CROSS-REFERENCE TO RELATED APPLICATION

This application claims priority from Japanese Patent Application No. 2013-204999 filed on Sep. 30, 2013, the entire subject matter of which is incorporated herein by reference.

TECHNICAL FIELD

This disclosure relates to a structure of a semiconductor device having a MOS (Metal Oxide Semiconductor) structure, and a method of manufacturing the same.

BACKGROUND

A MOSFET using silicon carbide (SiC) is used as a power semiconductor device. JP-A-2012-253293 discloses an example of a structure of the MOSFET using SiC. FIG. 4A schematically illustrates a structure from a gate structure to a source electrode in the semiconductor device (MOSFET). In the semiconductor device 80, a semiconductor substrate 90 made of SiC and having an n-type layer 91 formed on a surface thereof is used. A p-type diffusion layer 92 is locally formed in the n-type layer 91. In the p-type diffusion layer 92, an $n^+$-type diffusion layer 93 of an n-type having a carrier concentration higher than the n-type layer 91 is formed. In the $n^+$-type diffusion layer 93, an $n^{++}$-type diffusion layer (a high concentration impurity layer) 94 of an n-type having a carrier concentration higher than the $n^+$-type diffusion layer 93 is formed. The n-type layer 91 is formed on an epitaxial substrate (not shown) by an epitaxial growth. The p-type diffusion layer 92, the $n^+$-type diffusion layer 93 and the $n^{++}$-type diffusion layer 94 are respectively formed by a heat treatment after ion implantations. The n-type layer 91 becomes a drain region of the MOSFET and the $n^+$-type diffusion layer 93 becomes a source region of the MOSFET.

A gate oxide film 81 is formed to cover the p-type diffusion layer 92 between the n-type layer 91 and the $n^+$-type diffusion layer 93 on the surface of the semiconductor substrate 90. A gate electrode 82 made of polycrystalline silicon, which is highly doped to be conductive, is formed on the gate oxide film 81. By a voltage applied to the gate electrode 82, a channel is induced on a surface of the p-type diffusion layer 92 between the drain region (the n-type layer 91 of the surface) and the source region (the $n^+$-type diffusion layer 93 of the surface) and a switching (on/off) of current is thereby controlled.

An interlayer insulation layer 83 is formed to cover the gate electrode 82 and a periphery thereof. The interlayer insulation layer 83 is opened on the $n^{++}$-type diffusion layer 94 (the source region). In the opening, a silicide electrode 84 is formed on the $n^{++}$-type diffusion layer 94. The silicide electrode 84 is formed of Ni silicide (NiSi, $NiSi_2$ and the like), and a contact resistance between the silicide electrode 84 and the $n^{++}$-type diffusion layer 94 is low. The contact resistance can be lowered. To this end, phosphorous (P) becoming a donor in SiC is doped in a large amount in the $n^{++}$-type diffusion layer 94. A source electrode 85 is formed to cover an entire surface of the structure. In particular, when an impurity concentration of the $n^{++}$-type diffusion layer 94 is high, it is possible to make a resistance between the source region (the $n^+$-type diffusion layer 93 of the surface) and the source electrode 85 small.

Meanwhile, FIG. 4A shows that the source electrode 85 is formed over the entire surface. Actually, however, a patterning is made on the surface of the semiconductor substrate 90 so that the source electrode 85 and the gate electrode 82 are separated and leaded out. Also, although a drain electrode is not shown in FIG. 4A, the drain electrode is also appropriately leaded out from the surface or backside of the semiconductor substrate 90. The interlayer insulation layer 83 is also appropriately patterned in correspondence to the source and drain electrodes.

FIG. 4B is a sectional view illustrating a structure just after the gate electrode 82 is patterned when manufacturing the semiconductor device 80. The structure of FIG. 4A is formed by performing a process (1) of opening an upper side of the $n^{++}$-type diffusion layer 94 after forming the interlayer insulation layer 83 on the entire surface, a process (2) of forming the silicide electrode 84 in the opening, a process (3) of forming the source electrode 85 and the like for the structure of FIG. 4B. Although both the gate oxide film 81 and the interlayer insulation layer 83 have $SiO_2$ as a main component, the gate oxide film 81 is formed to be thin by thermal oxidation and the interlayer insulation layer 83 is formed to be thicker than the gate oxide film 81 by a CVD method and the like.

When manufacturing a MOSFET of Si, a gate oxide film is formed on a semiconductor substrate by thermal oxidation, a gate electrode thereon is patterned and then a diffusion layer (the $n^+$-type diffusion layer 93) becoming a source region is formed. However, when manufacturing the MOSFET of SiC, since a temperature of the heat treatment for forming the diffusion layer is very high, it is difficult to form the gate oxide film and the like before forming the diffusion layer. For this reason, in order to manufacture the structure of FIG. 4B, the process of forming the gate oxide film 81 is performed after forming the p-type diffusion layer 92, the $n^+$-type diffusion layer 93 and the $n^{++}$-type diffusion layer 94 in the semiconductor substrate 90 having the n-type layer 91.

SUMMARY

When forming the gate oxide film 81 by the thermal oxidation, Si, which is one species of atoms configuring the surface of the semiconductor substrate 90, is coupled with oxygen to form $SiO_2$ by which the gate oxide film 81 having the same as a main component is formed. For this reason, a film formation rate and a film quality of the gate oxide film 81 largely depends on a crystalline state close to the surface of the semiconductor substrate 90. First, the film formation rate is highly influenced by the crystallinity of the surface. For example, in a region in which the ions are heavily implanted and thus many crystal defects are generated, an enhanced oxidation occurs and the film formation rate is thus increased. For this reason, the gate oxide film 81 becomes thicker on the $n^{++}$-type diffusion layer 94 having a high impurity concentration than on the p-type diffusion layer 92 and the like, and the structure of FIG. 4B actually becomes the structure as shown in FIG. 5.

Also, the impurities contained in the surface of the semiconductor substrate 90 enter the formed gate oxide film 81. For this reason, as described above, since phosphorus (P) is heavily doped in the $n^{++}$-type diffusion layer 94, particularly, the P atoms are also introduced into the gate oxide film 81 in a large amount. In the $SiO_2$ film containing the large amount of P atoms, compactness of the film is lowered, so that a dielectric resistance is reduced. That is, the dielectric resistance is lowered in the part at which the gate oxide film 81 is formed to be thicker. In the configuration of FIG. 5, the channel is formed on the surface of the p-type diffusion layer 92. However, it is required that the gate electrode 81 should be formed up to the left side of the p-type diffusion layer 92. In this case, a left end portion of the gate electrode 82 may be caught at the thickened part of the gate oxide film 81 due to the enhanced oxidation. In this case, a gate withstanding voltage is lowered due to the corresponding part.

Alternatively, in order to avoid the above problem, a structure is adopted in which a width of the $n^+$-type diffusion layer 93 on the surface of the semiconductor substrate 90 is sufficiently widened and an interval between an end portion of the gate electrode 82 and the $n^{++}$-type diffusion layer 94 is sufficiently widened. In this case, however, it is difficult to make the entire device small.

As described above, in the MOS structure, it is difficult to reduce the negative influence due to the non-uniformity of the gate oxide film resulting from the heavily-doped impurities.

In view of the above, this disclosure provides at least a semiconductor device and a method of manufacturing the same.

Aspects of this disclosure will be described below. A semiconductor device of this disclosure includes: a gate oxide film that is formed on a surface of a semiconductor substrate; a gate electrode that is formed on the gate oxide film; and a high concentration impurity layer that is connected to a main electrode and formed on the surface of the semiconductor substrate. An impurity species doped in the high concentration impurity layer comprises a first impurity species of phosphorous and a second impurity species of at least one of argon and nitrogen, a concentration of the second impurity species is higher than a concentration of the first impurity species in a surface of the high concentration impurity layer, and a peak position of a concentration distribution of the first impurity species in a depth direction in the high concentration impurity layer is deeper than a peak position of a concentration distribution of the second impurity species in the depth direction.

In the above-described semiconductor device, a thickness of the gate oxide film on the high concentration impurity layer may be thicker than a thickness of the gate oxide film on a region in which a channel is formed below the gate electrode.

In the above-described semiconductor device, the high concentration impurity layer and the main electrode may be connected at a portion dug down from a surface of the high concentration impurity layer.

In the above-described semiconductor device, the high concentration impurity layer and the main electrode may be connected with interposing a silicide electrode therebetween.

In the above-described semiconductor device, the silicide electrode may be made of nickel silicide.

In the above-described semiconductor device, an impurity concentration in the high concentration impurity layer may be $5 \times 10^{19}$ cm$^{-3}$ or higher.

In the above-described semiconductor device, the semiconductor substrate may be made of silicon carbide.

A method of manufacturing the above-described semiconductor device, the method may includes forming the high concentration impurity layer by ion-implanting the first impurity species and the second impurity species into the semiconductor substrate so that a range of the first impurity species is larger than a range of the second impurity species; forming the gate oxide film by thermally oxidizing the semiconductor substrate; forming a gate electrode on the gate oxide film; and connecting the main electrode to the high concentration impurity layer.

In the above-described manufacturing method, in the connecting the main electrode to the high concentration impurity layer, an etching to dig down a surface of the high concentration impurity layer in a region to which the main electrode is connected may be performed before connecting the main electrode.

In the above-described manufacturing method, the main electrode may be connected to the high concentration impurity layer with a silicide electrode being interposed therebetween.

In the above-described manufacturing method, the semiconductor substrate may be made of silicon carbide.

Since this disclosure is configured as described above, it is possible to reduce the negative influence due to the non-uniformity of the gate oxide film resulting from the heavily-doped impurities.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Hereinafter, a semiconductor device according to an illustrative embodiment of this disclosure will be described. The semiconductor device is a MOSFET in which a current flowing through a source electrode (a main electrode) is switched (on-and-off control) by a gate electrode formed on a semiconductor substrate. The MOSFET is formed on a semiconductor substrate made of silicon carbide (SiC).

In the semiconductor device, impurities of an $n^{++}$-type diffusion layer (a high concentration impurity layer) used for a contact with a main electrode and a distribution of the impurities are optimized. Thereby, a negative influence due to enhanced oxidation of a gate oxide film is reduced.

Figure 1:
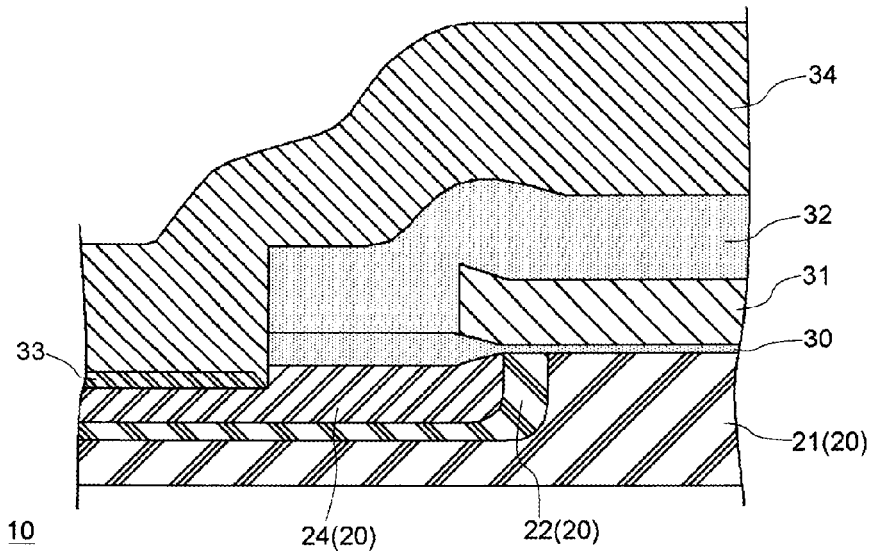
FIG. 1 is a sectional view of a semiconductor device according to an illustrative embodiment of this disclosure.
Figure 4A:
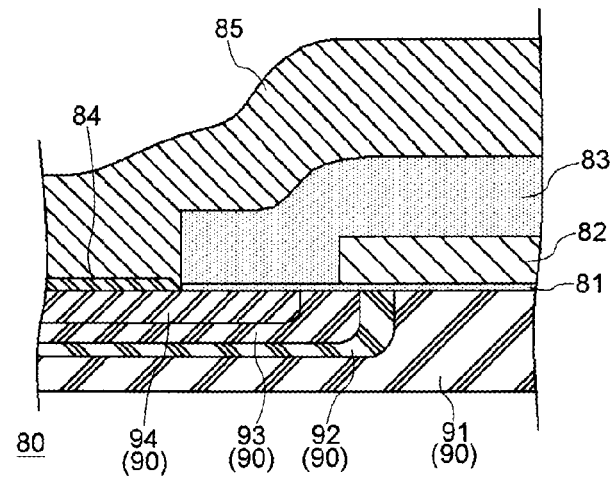
FIG. 4A is a sectional view schematically illustrating an example of a structure of a semiconductor device according to the related art.
Figure 4B:
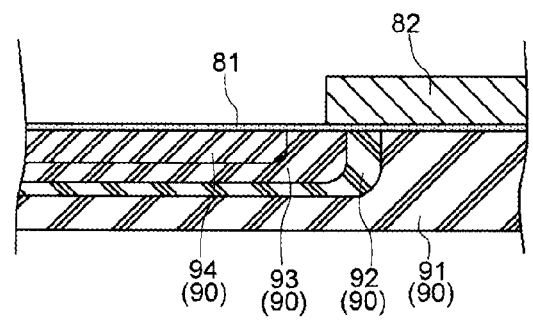
FIG. 4B is a sectional view of the semiconductor device during a manufacturing process thereof.

FIG. 1 is a sectional view illustrating a structure of the semiconductor device 10. FIG. 1 illustrates a structure from a gate region to a source region in the semiconductor device 10, which corresponds to FIG. 4A. Also in the semiconductor device 10, a semiconductor substrate 20 having an n-type layer 21 is used and a p-type diffusion layer 22 is formed in the n-type layer 21. Also, an $n^{++}$-type diffusion layer 24 (a high concentration impurity layer) configured to function as a source region is provided in the p-type diffusion layer 22. Contrary to the configuration of FIGS. 4A and 4B, an $n^+$-type layer is not provided between the p-type diffusion layer 22 and the $n^{++}$-type diffusion layer 24.

Figure 2:
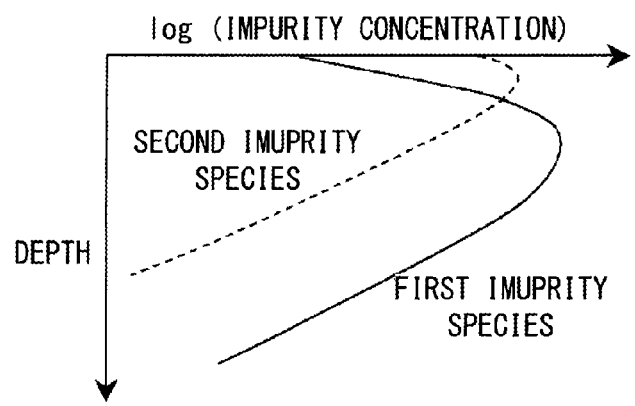
FIG. 2 is a view schematically illustrating an impurity distribution in a high concentration impurity layer.

The $n^{++}$-type diffusion layer (a high concentration impurity layer) 24 is formed by an ion implantation, as described later. At this time, at least two types of impurity species are implanted. One (a first impurity species) of the impurity species is phosphorous (P), and the other (a second impurity species) of the impurity species is argon (Ar) or nitrogen (N). The first impurity species functions as a donor in SiC, particularly. The second impurity species, argon (Ar) does not function as a donor, and nitrogen (N) functions as a donor. However, the second impurity species is mainly used to adjust a crystalline state of a surface of the $n^{++}$-type diffusion layer 24. To this end, a concentration of the second impurity species is set to be high in the surface of the $n^{++}$-type diffusion layer 24, particularly and is higher than the first impurity species in the surface. On the other hand, a concentration of the first impurity species is set to be low in the surface but to be high in a deep region of the $n^{++}$-type diffusion layer 24. To this end, a peak of a concentration distribution of the first impurity species is set at a position deeper than a peak of a concentration distribution of the second impurity species. FIG. 2 is a view schematically illustrating the concentration distributions of the first impurity species and second impurity species in a depth direction.

Figure 5:
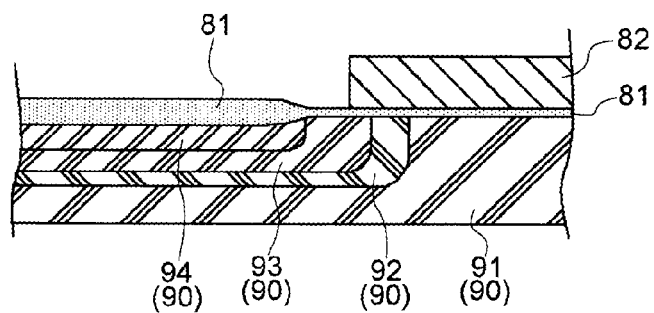
FIG. 5 is a sectional view illustrating in more detail a section of the semiconductor device according to the related art during the manufacturing process thereof.

Also, a shape of a gate oxide film 30 is the same as that shown in FIG. 5 and is formed to be thicker on the $n^{++}$-type diffusion layer 24 than on the p-type diffusion layer 22 and the like. In the meantime, a channel is formed in a surface of the p-type diffusion layer 22 just below a gate electrode 31.

Also, a silicide electrode 33 is formed on a surface of the $n^{++}$-type diffusion layer 24 exposed through an opening provided in an interlayer insulation layer 32. A source electrode 34 is connected to the $n^{++}$-type diffusion layer 24 with the silicide electrode 33 being interposed therebetween.

The gate oxide film 30 used in the semiconductor device 10 has the same shape as the gate oxide film 81 in the configuration of FIG. 5. However, a dielectric resistance thereof is higher. For this reason, a lowering of the withstanding voltage due to a film quality of the gate oxide film 30 is not caused. Also, the semiconductor device 10 can be easily manufactured by a following manufacturing method.

FIGS. 3A to 3J are process sectional views illustrating the manufacturing method of the semiconductor device (MOSFET) 10.

Figure 3A:
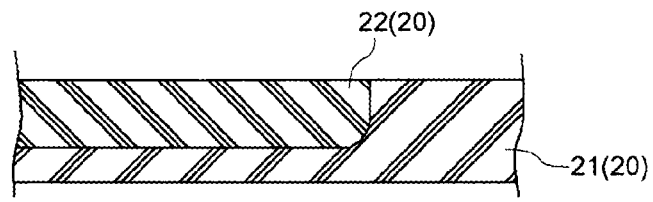
FIGS. 3A to 3J are process sectional views illustrating a method of manufacturing the semiconductor device according to the illustrative embodiment of this disclosure.

First, as shown in FIG. 3A, the p-type diffusion layer 22 is formed in the semiconductor substrate 20 made of SiC and having the n-type layer 21 formed on the surface thereof. The p-type diffusion layer 22 is formed by a heat treatment after acceptor impurities are ion-implanted into a desired region in the semiconductor substrate (the n-type layer 21) 20.

Figure 3B:
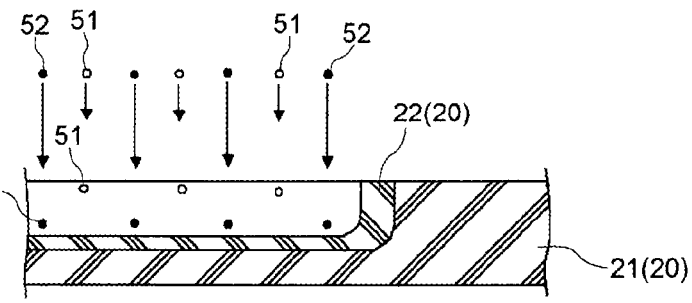

Subsequently, as shown in FIG. 3B, donor impurities for forming the $n^{++}$-type diffusion layer 24 are ion-implanted into a desired region in the p-type diffusion layer 22 (a high concentration impurity layer formation process). Here, the $n^+$-type diffusion layer formed in the background art is not formed. Here, the main donor impurity species is phosphorous (P) that is the first impurity species. At this time, not only the phosphorus (P) but also ions (the second impurity species ions) except for phosphorous (P), which are much doped in the vicinity of the surface of the semiconductor substrate 20 (the p-type diffusion layer 22), are implanted. At this time, as shown in FIG. 2, the ion implantations are performed so that the second impurity species ions 51 are accumulated in the vicinity of the surface of the semiconductor substrate 20 (the p-type diffusion layer 22) and the phosphorous (P) ions (the first impurity species ions 52) are accumulated at a deeper portion. That is, the ion implantations are performed with the energy enabling a range of the first impurity species ions 52 to be deeper than that of the second impurity species ions 51 in the semiconductor substrate 20 (the p-type diffusion layer 22).

Figure 3C:
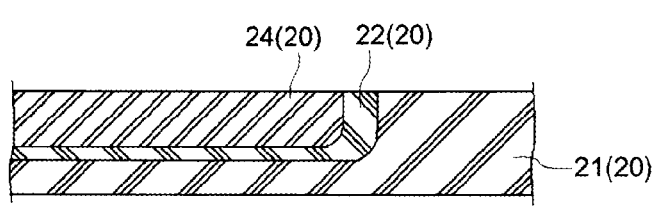

Thereafter, a heat treatment is performed, so that the $n^{++}$-type diffusion layer 24 is formed, as show in FIG. 3C. Meanwhile, in the above example, the p-type diffusion layer 22 is first formed by the ion implantation/heat treatment in FIG. 3A and then the second impurity species ions 51 and the first impurity species ions 52 are ion-implanted and the heat treatment is performed to form the $n^{++}$-type diffusion layer 24 in FIG. 3B. However, the ion implantation for forming the p-type diffusion layer 22 and the ion implantations of the second impurity species ions 51 and the first impurity species ions 52 may be continuously performed and then the heat treatment may be once performed to form the p-type diffusion layer 22 and the $n^{++}$-type diffusion layer 24. Contrary to the configuration of FIGS. 4A and 4B, since the $n^+$-type diffusion layer is not formed between the p-type diffusion layer 22 and the $n^{++}$-type diffusion layer 24, the $n^{++}$-type diffusion layer 24 becomes a source region in the semiconductor device 10.

Figure 3D:
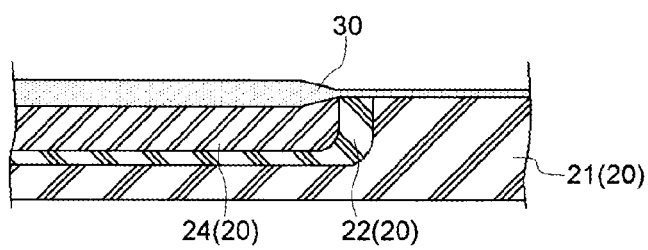

Then, as shown in FIG. 3D, the semiconductor substrate 20 is thermally oxidized to form the gate oxide film 30 (a gate oxidation process). At this time, since the second impurity species ions 51 are much implanted in the shallow region of the $n^{++}$-type diffusion layer 24, many crystal defects are generated and enhanced oxidation occurs, so that the gate oxide film 30 on the $n^{++}$-type diffusion layer 24 becomes thicker, as shown in FIG. 3D. This is the same as the structure of FIG. 5. However, since the phosphorous (P) atoms (the first impurity species ions 52) exist only at the deep portion of the $n^{++}$-type diffusion layer 24, the phosphorous (P) atoms are difficult to diffuse into the gate oxide film 30. For this reason, it is possible to suppress the dielectric resistance of the gate oxide film 30 from being lowered. This effect is appeared when the impurity concentration of the $n^{++}$-type diffusion layer 24 is high, as described above. For example, the effect is particularly conspicuous when the impurity concentration (including the first impurity species and the second impurity species) is $5 \times 10^{19}$ cm$^{-3}$ or higher.

Figure 3E:
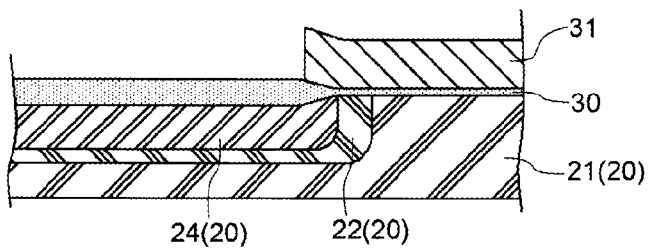

Subsequently, as shown in FIG. 3E, the gate electrode 31 is formed (a gate electrode formation process). At this time, contrary to the structure of FIG. 4A, since the $n^+$-type diffusion layer is not formed between the p-type diffusion layer 22 and the $n^{++}$-type diffusion layer 24, the gate electrode 31 extends even on the thickened region of the gate oxide film 30.

Figure 3F:
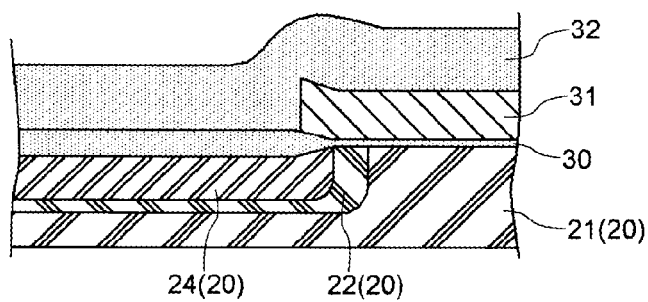

Then, as shown in FIG. 3F, the interlayer insulation layer 32 is formed (an interlayer insulation layer formation process). The interlayer insulation layer 32 is formed to be thicker than the gate oxide film 30 by the CVD method. For this reason, it is possible to cover the entire structure of FIG. 3E including a step portion of an end portion of the gate electrode 31 with the interlayer insulation layer 32.

Figure 3G:
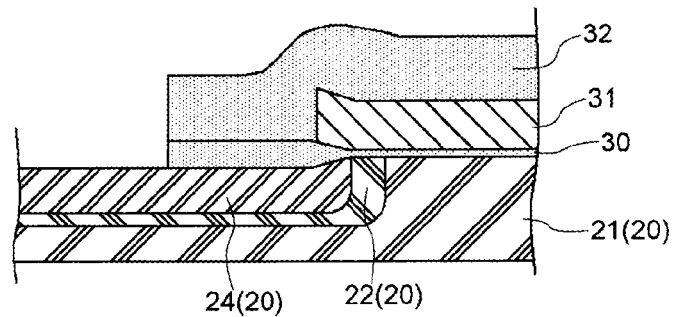

Subsequently, as shown in FIG. 3G, an opening is formed in the interlayer insulation layer 32 on the $n^{++}$-type diffusion layer 24 by a dry etching so as to form a contact with the source electrode, and the $n^{++}$-type diffusion layer 24 is exposed in the opening (an interlayer insulation layer opening process).

Figure 3H:
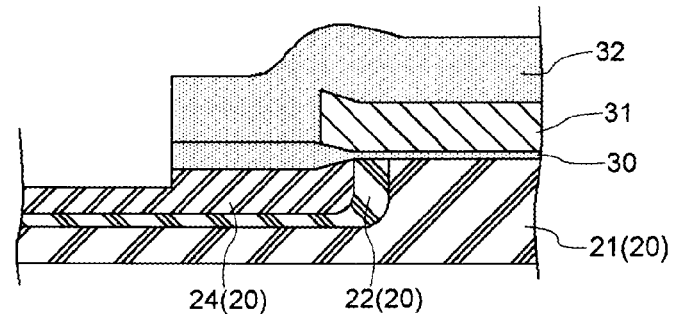

Then, as shown in FIG. 3H, the surface of the $n^{++}$-type diffusion layer 24 in the opening is etched and dug down (a high concentration impurity layer etching process). The etching is continued until the region of the $n^{++}$-type diffusion layer 24, in which the phosphorous (P) atoms (the first impurity species ions 52) are much accumulated and the low resistance is thus made, is exposed. The etching may be performed by a dry etching using $SF_6$, $SiH_2Cl_2$, $CF_4$ and the like.

Figure 3I:
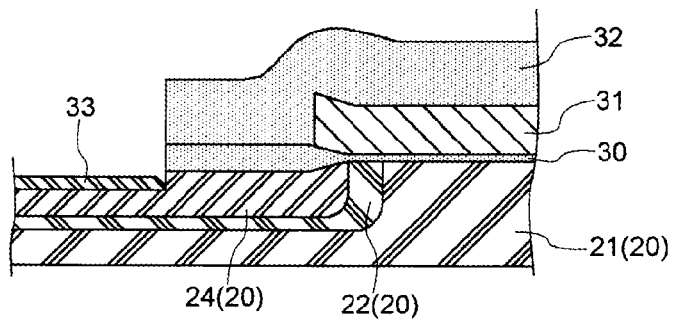

Subsequently, as shown in FIG. 3I, the silicide electrode 33 is formed in the dug region of the $n^{++}$-type diffusion layer 24 (a silicide electrode formation process). The silicide electrode 33 is made of Ni silicide and the like, for example. In this case, a film of a metal material (Ni or Ni silicide) becoming the silicide electrode 33 is formed in the shape of the silicide electrode 33 shown in FIG. 3I and then a heat treatment causing a silicide reaction of the film with the $n^{++}$-type diffusion layer 24 is performed to form the silicide electrode 33 having a low contact resistance. At this time, since the $n^{++}$-type diffusion layer 24 just below the metal material layer is changed into the silicide electrode 33 by the silicide reaction, a bottom surface of the finally formed silicide electrode 33 is preferably positioned at a depth at which the peak of the concentration distribution of the first impurity species exists.

Figure 3J:
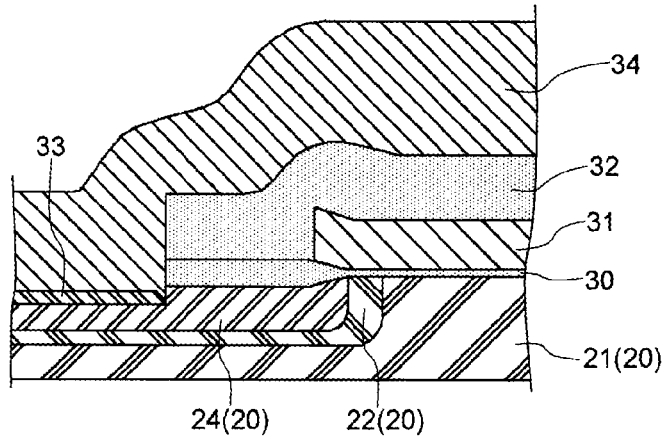

After that, as shown in FIG. 3J, the source electrode 34 is formed to cover the structure of FIG. 3I (a main electrode connecting process). The source electrode 34 has a two-layered structure in which a lower layer is a thin Ti layer and an upper layer is a thick Al layer, for example. The thickness thereof is set to be thick enough to connect a bonding wire onto the source electrode 34.

In the semiconductor device 10, the formation of the part of the gate oxide film 30 in which the dielectric resistance is low is suppressed, as described above. For this reason, it is possible to suppress the gate withstanding voltage defect due to the gate oxide film 30 thickened resulting from the enhanced oxidation. Therefore, it is not necessary to provide the $n^+$-type diffusion layer between the p-type diffusion layer 22 and the $n^{++}$-type diffusion layer 24. Also, it is possible to shorten the interval between the end portion of the gate electrode 31 and the silicide electrode 33 and the like. Thereby, it is possible to miniaturize the entire device.

Also, in the above configuration, the region in which the first impurity species ions 52 are much doped and the low resistance is made exists at the deep portion in the $n^{++}$-type diffusion layer 24. However, as shown in FIGS. 3H and 3I, since the silicide electrode 33 is formed in the dug deep region of the $n^{++}$-type diffusion layer 24, it is possible to reduce the contact resistance between the source electrode 34 and the source region (the $n^{++}$-type diffusion layer 24).

Also, in the above structure, there is a region in which the gate electrode 31 and the source region (the $n^{++}$-type diffusion layer 24) overlap with each other, as seen from a plan view. Alternatively, since the low withstanding voltage region is not formed in the gate oxide film 30, it is possible to provide the overlapping region. For this reason, it is possible to make the entire device small. may be increased by the corresponding structure, so that a high-speed operation may be difficult. However, since the gate oxide film 30 is formed to be thick in the region in which the gate electrode 31 and the source region (the $n^{++}$-type diffusion layer 24) overlap with each other, as seen from a plan view, the increase in the capacity between the gate and the source is suppressed. That is, although the gate electrode 31 and the source region (the $n^{++}$-type diffusion layer 24) are made to be close due to the miniaturization, the negative influence thereof is also reduced.

As described above, the semiconductor device 10 can be easily manufactured by the manufacturing method shown in FIGS. 3 and 4.

Meanwhile, in the above configuration, the silicide electrode 33 is formed in the dug region of the $n^{++}$-type diffusion layer 24. However, the source electrode 34 is not necessary to dig inasmuch as the sufficiently low contact resistance is obtained. Also, although the silicide electrode 33 is made of Ni silicide, the other silicide electrode can be also used. Alternatively, the silicide electrode 33 is not necessary inasmuch as the sufficiently low contact resistance is obtained.

Also, in the above illustrative embodiment, the semiconductor substrate is made of SiC. However, it is obvious that when the gate oxide film is formed after the formation of the source region and the like and the structure around the gate electrode is the same, the same effects can be accomplished even though the semiconductor substrate is made of another semiconductor material, for example, silicon (Si).

In the above illustrative embodiment, the semiconductor device is the MOSFET. However, it is obvious that the same structure and manufacturing method are effective for a semiconductor device having the same structure in the vicinity of the gate electrode, for example, IGBT (Insulated Gate Bipolar Transistor).

What is claimed is:

1. A semiconductor device comprising:
   a gate oxide film that is formed on a surface of a semiconductor substrate;
   a gate electrode that is formed on the gate oxide film; and
   a high concentration impurity layer that is connected to a main electrode and formed on the surface of the semiconductor substrate,
   wherein an impurity species doped in the high concentration impurity layer comprises a first impurity species of phosphorus and a second impurity species of argon,
   wherein a concentration of the second impurity species is higher than a concentration of the first impurity species in a surface of the high concentration impurity layer,
   wherein a peak position of a concentration distribution of the first impurity species in a depth direction in the high concentration impurity layer is deeper than a peak position of a concentration distribution of the second impurity species in the depth direction,
   wherein a thickness of the gate oxide film on the high concentration impurity layer is thicker than a thickness of the gate oxide film on a region in which a channel is formed below the gate electrode, and
   wherein the gate electrode extends on the thickened region of the gate oxide film.

2. The semiconductor device according to claim 1, wherein the high concentration impurity layer and the main electrode are connected at a portion dug down from a surface of the high concentration impurity layer.

3. The semiconductor device according to claim 1, wherein the high concentration impurity layer and the main electrode are connected with interposing a silicide electrode therebetween.

4. The semiconductor device according to claim 3, wherein the silicide electrode is made of nickel silicide.

5. The semiconductor device according to claim 1, wherein an impurity concentration in the high concentration impurity layer is $5 \times 10^{19}$ cm$^{-3}$ or higher.

6. The semiconductor device according to claim 1, wherein the semiconductor substrate is made of silicon carbide.

7. A method of manufacturing the semiconductor device according to claim 1, the method comprising:
   forming the high concentration impurity layer by ion-implanting the first impurity species of phosphorus and the second impurity species of argon into the semiconductor substrate so that a concentration of the first impurity species is larger than a concentration of the second impurity species;
   forming the gate oxide film by thermally oxidizing the semiconductor substrate;
   forming a gate electrode on the gate oxide film; and
   connecting the main electrode to the high concentration impurity layer.

8. The method according to claim 7, wherein in the connecting the main electrode to the high concentration impurity layer, an etching to dig down a surface of the high concentration impurity layer in a region to which the main electrode is connected is performed before connecting the main electrode.

9. The method according to claim 7,
wherein the main electrode is connected to the high concentration impurity layer with a silicide electrode being interposed therebetween.

10. The method according to claim 7,
wherein the semiconductor substrate is made of silicon carbide.

* * * * *